(12) United States Patent
Liou et al.

(10) Patent No.: US 6,331,464 B1
(45) Date of Patent: Dec. 18, 2001

(54) METHOD OF FABRICATING A FLASH MEMORY

(75) Inventors: Liann-Chern Liou, Taipei Hsien; Guang-Sheng Lai, Taichung, both of (TW)

(73) Assignee: United Microelectronics Corp., Hsinchu (TW)

( * ) Notice: Subject to any disclaimer, the term of this patent is extended or adjusted under 35 U.S.C. 154(b) by 18 days.

(21) Appl. No.: 09/677,166

(22) Filed: Oct. 2, 2000

(30) Foreign Application Priority Data

Sep. 8, 2000 (TW) .............................. 89118399 A

(51) Int. Cl.⁷ .................................. H01L 21/336
(52) U.S. Cl. .................... 438/257; 438/259; 438/266; 438/267
(58) Field of Search .................... 438/257, 258, 438/251, 260, 261, 262, 263, 264, 265, 266, 267, 304, 596

(56) References Cited

U.S. PATENT DOCUMENTS

| | | | |
|---|---|---|---|
| 5,427,968 | * 6/1995 | Hong | 438/257 |
| 5,474,947 | * 12/1995 | Chang et al. | 438/257 |
| 5,476,801 | * 12/1995 | Keshtbod | 438/257 |
| 5,702,965 | * 12/1997 | Kim | 47/43 |
| 5,756,384 | * 5/1998 | Tseng | 438/233 |
| 6,172,394 | * 1/2001 | Nakagawa | 257/315 |

* cited by examiner

Primary Examiner—Charles Bowers
Assistant Examiner—Jack Chen
(74) Attorney, Agent, or Firm—Thomas, Kayden, Horstemeyer & Risley, L.L.P.

(57) ABSTRACT

A method of fabricating a flash memory provides a substrate having a tunnel oxide layer, a first conductive layer and a first material layer thereon. A conductive spacer is formed on the sidewalls of the first conductive layer and the first material layer. A second material layer is formed on the substrate. A portion of the second material layer is removed, until a part of the conductive spacer has been exposed. The remaining portion of the second and first material layers are removed, to expose the first conductive layer and the conductive spacer. The first conductive layer and the conductive spacer, together then form a floating gate. A dielectric film layer is then formed on the substrate, and a second conductive layer is subsequently formed above the dielectric film layer.

14 Claims, 3 Drawing Sheets

METHOD OF FABRICATING A FLASH MEMORY

CROSS-REFERENCE TO RELATED APPLICATION

This application claims the priority benefit of Taiwan application serial no. 89118399, filed Sep. 8, 2000.

BACKGROUND OF THE INVENTION

1. Field of the Invention

The present invention relates to a method of fabricating a semiconductor device. More particularly, the present invention relates to a method of fabricating a flash memory.

2. Description of the Related Art

Conventional non-volatile flash memory devices such as erasable programmable read only memories (EPROM), electronically erasable programmable read only memories (EEPROM), and flash memories do not lose their stored information when power is lost. Because these devices have superior information storage capacity, they are the subjects of ongoing related research.

Electronically erasable programmable read only memory (EEPROM) is a kind of non-volatile memory. Most EEPROM cells have two gates, including a floating gate made of polysilicon to store charge and a control gate used to control information storage. The floating gate is usually in a "floating" state. That is to say, no lines are connected to it. The control gate is often connected to a word line. A tunnel oxide layer and a dielectric layer are arranged between the substrate and floating gate and the floating gate and control gate, respectively. Additionally, source and drain regions are arranged in the substrate on both sides of the control gate.

Generally, as the gate-coupling ratio between the floating gate and the control gate increases, the work voltage necessary to operate the memory transistor decreases. As a consequence, the operational speed and efficiency of the flash memory increase tremendously. Methods for increasing the gate-coupling ratio (GCR) include: increasing the overlapped area between the floating and the control gate, reducing the thickness of the dielectric layer between the floating gate and the control gate, and increasing the dielectric constant (k) of the dielectric layer between the floating gate and the control gate. Generally, to achieve an increase in the overlapped area between the floating and control gates and thus increase the gate-coupling ratio (GCR), the size of the floating gate has to be increased. However, this is not desirable for the demands of today's highly-integrated technologies.

SUMMARY OF THE INVENTION

Accordingly, one object of the present invention is to provide a method of fabricating a flash memory. The method comprises the steps of providing a substrate having a tunnel oxide layer, a first conductive layer and a first material layer formed thereon. A conductive spacer is formed on the sidewalls of the first conductive layer and the first material layer. A second material layer is formed on the substrate. A portion of the second material layer is removed, until a part of the conductive spacer has been exposed. The remaining portion of the second and first material layers is removed, to expose the first conductive layer and the conductive spacer. The first conductive layer and the conductive spacer, together then form a floating gate. A dielectric film layer is then formed on the substrate, and a second conductive layer is subsequently formed above the dielectric film layer.

According to a preferred embodiment of the present invention, the step of removing a portion of the second material layer also includes simultaneously removing the top edge of the conductive spacer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain the principles of the invention. In the drawings.

DESCRIPTION OF THE PREFERRED EMBODIMENTS

Figure 1:
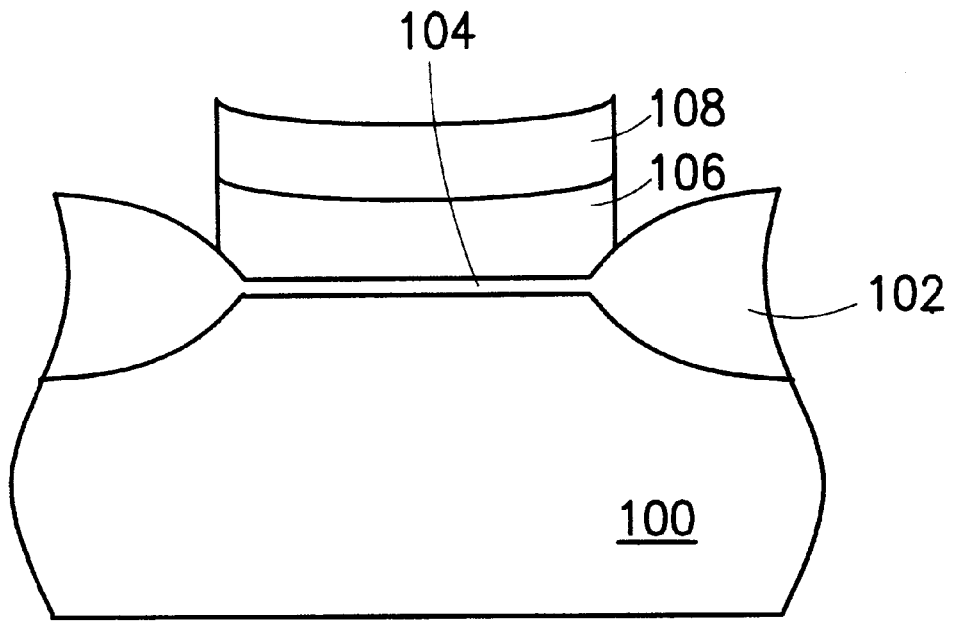
FIGS. 1–6 are schematic drawings showing the fabrication of a flash memory according to one preferred embodiment of the present invention.
Figure 2:
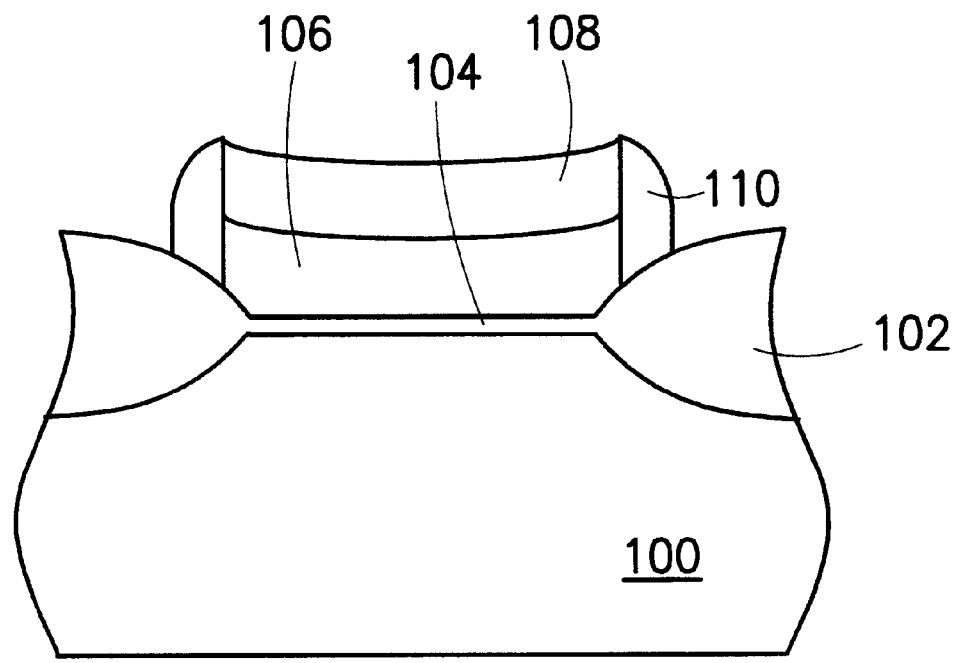

As shown in FIG. 1, isolation regions 102 and a tunnel oxide layer 104, between isolation regions 102, are formed on a substrate 100 provided. A stacked conductive layer 106 is polysilicon and material layer 108 are formed sequentially over the tunnel oxide layer 104. The material for the tunnel oxide layer can include silicon oxide. The thickness of material layer 108 can be adjusted depending on the surface of the floating gate formed in a subsequent step. As shown in FIG. 2, a conductive spacer 110 is formed on the sidewalls of the stacked conductive layer 106 and material layer 108. The material for the conductive spacer 110 can include polysilicon. The method for forming the conductive spacer 110 includes forming a polysilicon layer on the substrate 100. An anisotropic etching procedure is performed to remove a portion of the polysilicon layer and form a conductive spacer on the sidewalls of the conductive layer 106 and material layer 108.

Figure 3:
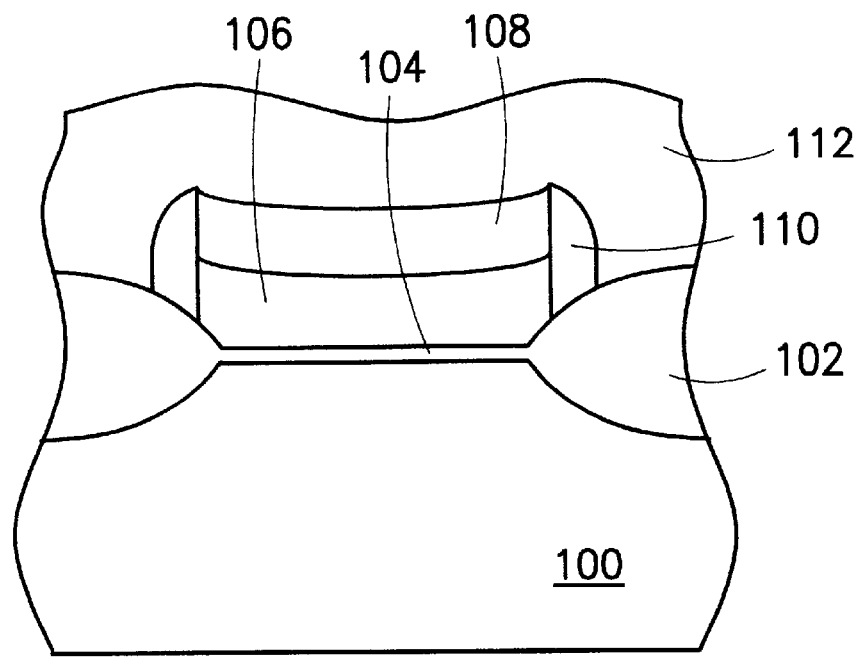

As shown in FIG. 3, a material layer 112 is formed on the substrate 100. The material for the material layer 112 can include silicon oxide. Preferably, the material for the material layer 112 and the material layer 108 are similar, preferably the same.

Figure 4:
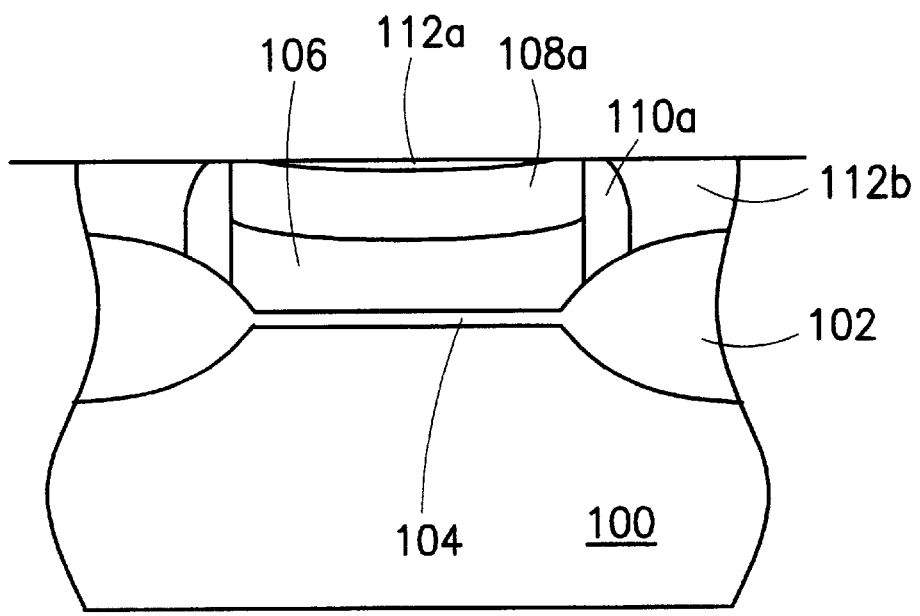

As shown in FIG. 4, a portion of the material layer 112 is etched to the point where the top edge of the conductive spacer has been removed, forming exposed conductive spacer 110a. The method for removing a portion of the material layer can include an etch back procedure or a chemical mechanical polishing (CMP) step. After a portion of the material layer 112 has been removed, a material layer 112a remains over the material layer 108. Because the top edge of the conductive spacer 110 has been removed, a sharp current leakage can be prevented during the subsequent operation of the flash memory.

Figure 5:
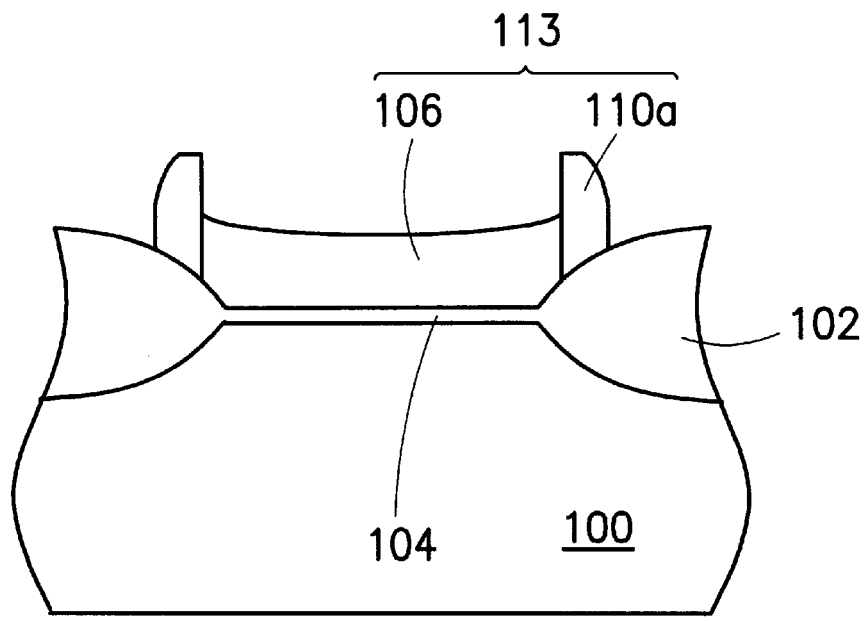

As shown in FIG. 5, the material layers 112a, 112b, and 108 are etched until the conductive layer 106 and the conductive spacer 110a are exposed. The conductive layer 106 and the conductive spacer 110a together form a floating gate 113. The method for removing the material layers 112a, 112b, and 108 can include a wet etching procedure using hydrofluoric acid (HF) or a buffered oxide agent as an etching solution.

The conductive layer 110a protrudes through the surface of the conductive layer 106, providing the floating gate 113 with additional surface area. Thus, the dimensions of the overlapped surface area, between the floating gate 113 and the control gate formed in a later step, can be increased without having to increase the width of the floating gate. As a consequence, the coupling ration between the floating gate and the control gate increase dramatically.

Figure 6:
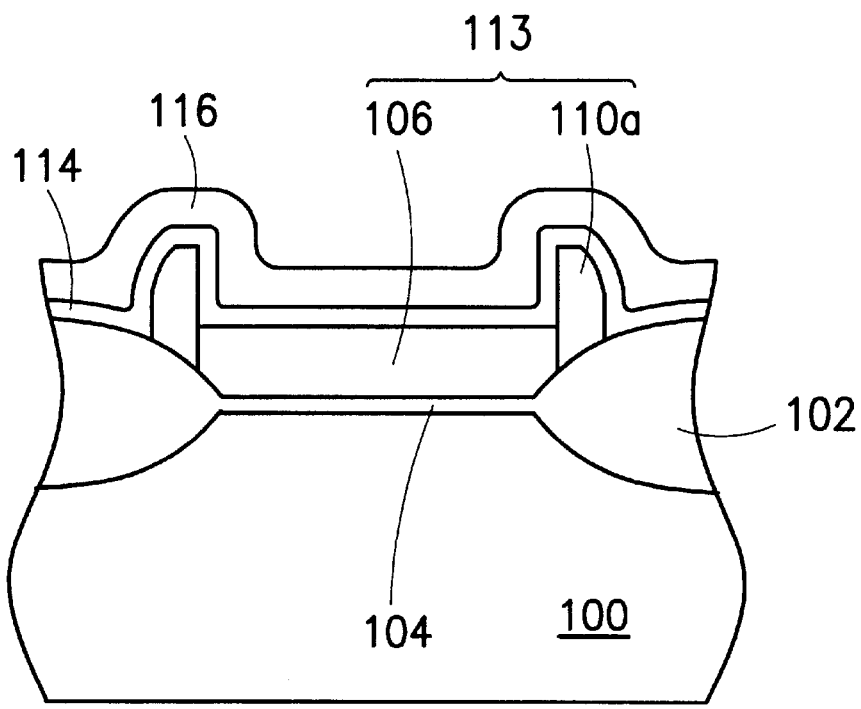

As shown in FIG. 6, a dielectric film layer 114 is ONO and a conductive layer 116 are formed sequentially on the substrate 100. The conductive layer 116 serves as the control gate for the flash memory.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a flash memory, comprising:

providing a substrate having a tunnel oxide layer, a first conductive layer, and a first material layer thereon;

forming a conductive spacer on sidewalls of the first conductive layer and the first material layer;

forming a second material layer on the substrate and on the first material layer;

removing a part of the second material layer and a top edge of the conductive spacer to expose a portion of the conductive spacer;

removing a remaining portion of the second material layer and the conductive spacer and first material layer to expose the first conductive layer and the conductive spacer, which together form a floating gate;

forming a dielectric film layer on the substrate; and forming a second conductive layer above the dielectric film layer.

2. The method of claim 1, wherein the step of removing a part of the second material layer further includes simultaneously removing the top edge of the conductive spacer.

3. The method of claim 1, wherein the method for removing a portion of the second material layer includes an etch back procedure.

4. The method of claim 1, wherein the method for removing a portion of the second material layer includes a chemical mechanical polishing (CMP) method.

5. The method of claim 1, wherein the second material layer includes silicon oxide.

6. The method of claim 1, wherein the first conductive layer includes polysilicon.

7. The method of claim 1, wherein the dielectric film layer includes an ONO layer.

8. The method of claim 1, wherein a material for the first and second material layers is the same.

9. A method of fabricating a floating gate on a substrate having a tunnel oxide layer, a conductive layer, and a first material layer, the method comprising:

forming a conductive spacer on sidewalls of the conductive layer and the first material layer;

forming a second material layer on the substrate and on the first material layer;

removing a portion of the second material layer and a top edge of the conductive spacer to expose a part of the conductive spacer; and removing a remaining portion of the second and first material layers, to expose the conductive layer and the conductive spacer, which then together form a floating gate.

10. The method of claim 9, wherein the method for removing a portion of the second material layer includes an etch back procedure.

11. The method of claim 9, wherein the method for removing a portion of the second material layer includes a chemical mechanical polishing (CMP) method.

12. The method of claim 9, wherein the second material layer includes silicon oxide.

13. The method of claim 9, wherein the first material layer includes silicon oxide.

14. The method of claim 9, wherein a material for the first and second material layers is the same.

* * * * *